United States Patent [19]

Tago et al.

[11] Patent Number: 5,059,834

[45] Date of Patent: Oct. 22, 1991

[54] CIRCUIT DEVICE FOR ELIMINATING NOISE FROM AN INPUT SIGNAL INDEPENDENT OF TIME OF ARRIVAL OF NOISE OR NOISE WIDTH

[75] Inventors: Haruyuki Tago, Kawasaki; Yasuo Yamada, Yokohama, both of Japan

[73] Assignee: Kabushiki Kaisha Toshiba, Kawasaki, Japan

[21] Appl. No.: 512,153

[22] Filed: Apr. 20, 1990

[30] Foreign Application Priority Data

Apr. 25, 1989 [JP] Japan .................................. 1-103517

[51] Int. Cl.$^5$ .............................................. H03K 5/22
[52] U.S. Cl. ..................................... 307/542; 307/443; 307/480; 307/542.1; 328/165
[58] Field of Search ..................... 307/443, 517, 542.1, 307/265, 480, 542; 328/111, 112, 130.1, 165

[56] References Cited

U.S. PATENT DOCUMENTS

| 4,282,488 | 8/1981 | Norman et al. | 328/112 |
| 4,727,314 | 2/1988 | Lapeyrolerie et al. | 307/517 |
| 4,760,279 | 7/1988 | Saito et al. | 307/443 |
| 4,775,840 | 10/1988 | Ohmori et al. | 328/165 |
| 4,926,072 | 5/1990 | Hyodo | 307/542.1 |
| 4,939,396 | 7/1990 | Schoettmer | 307/443 |

FOREIGN PATENT DOCUMENTS 0048714 5/1981 Japan .................................. 307/542.1

Primary Examiner—Stanley D. Miller
Assistant Examiner—Scott A. Ouellette
Attorney, Agent, or Firm—Oblon, Spivak, McClelland, Maier & Neustadt

[57] ABSTRACT

A noise eliminating circuit for identifying and eliminating a noise component from an input signal and obtaining a normal signal as its output signal comprises first and second detectors and an output determining section. The first detector continuously monitors the logic level of the input signal by at least one first detecting element for detecting that the inut signal is at a first logic level and detects that the input signal has the first logic level within a predetermined operating cycle, every the operating cycle. The second detector continuously monitors the logic level of the input signal by at least one second detecting element for detecting that the input signal is at a second logic level and detects that the input signal has the second logic level value within the predetermined operating cycle, every the operating cycle. The output determining section determines its output signal such that the output signal is made at the first logic level in a first case where only the first detector continues its detection over a predetermined time period, the output signal is made at the second logic level in a second case where only the second detector continues its detection over the predetermined time period, and the output signal is held at the logic level that it had previously in other cases than the first and second cases.

17 Claims, 9 Drawing Sheets

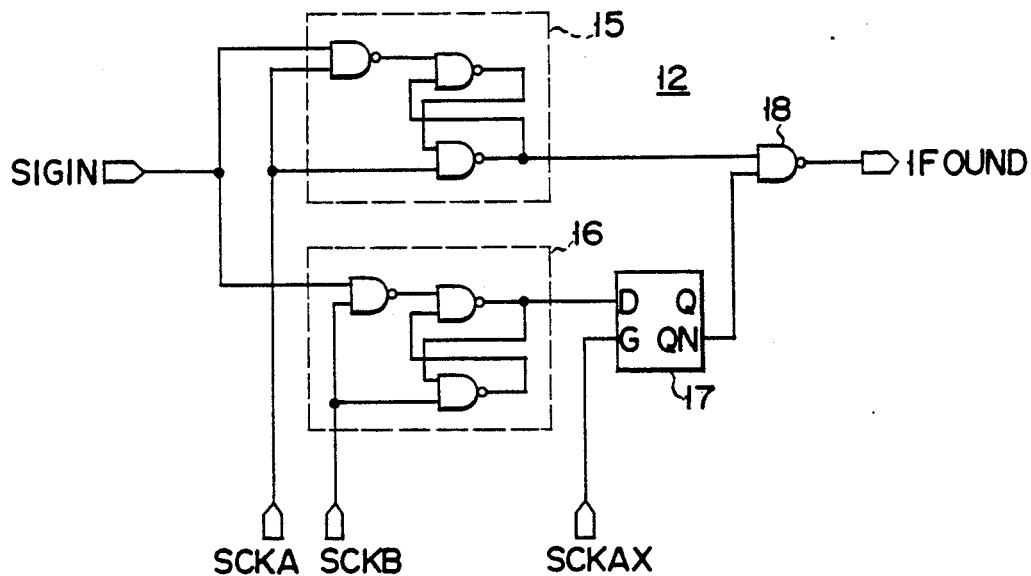
F I G. 4
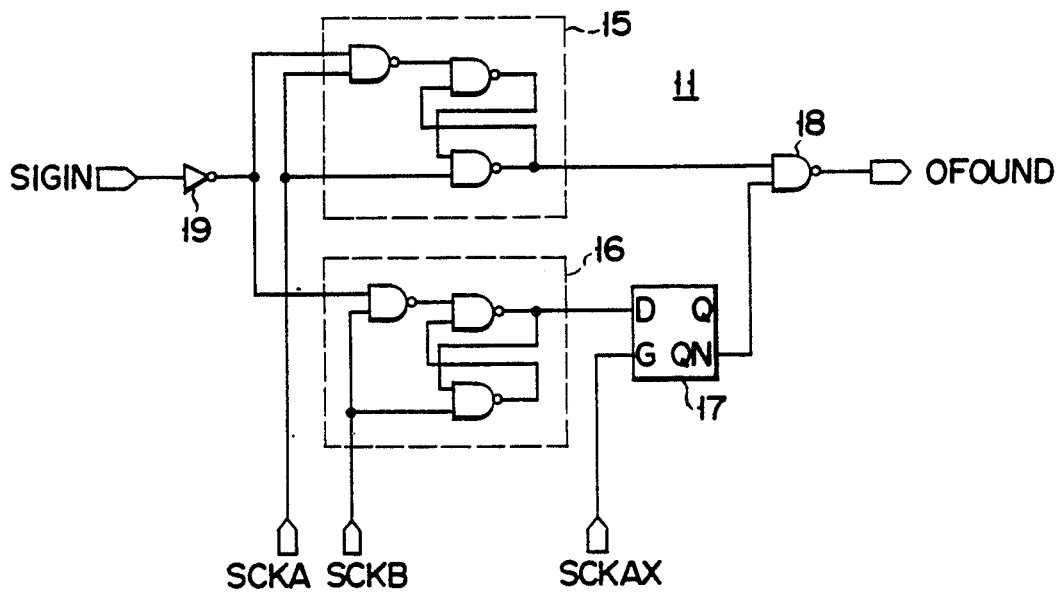
F I G. 5

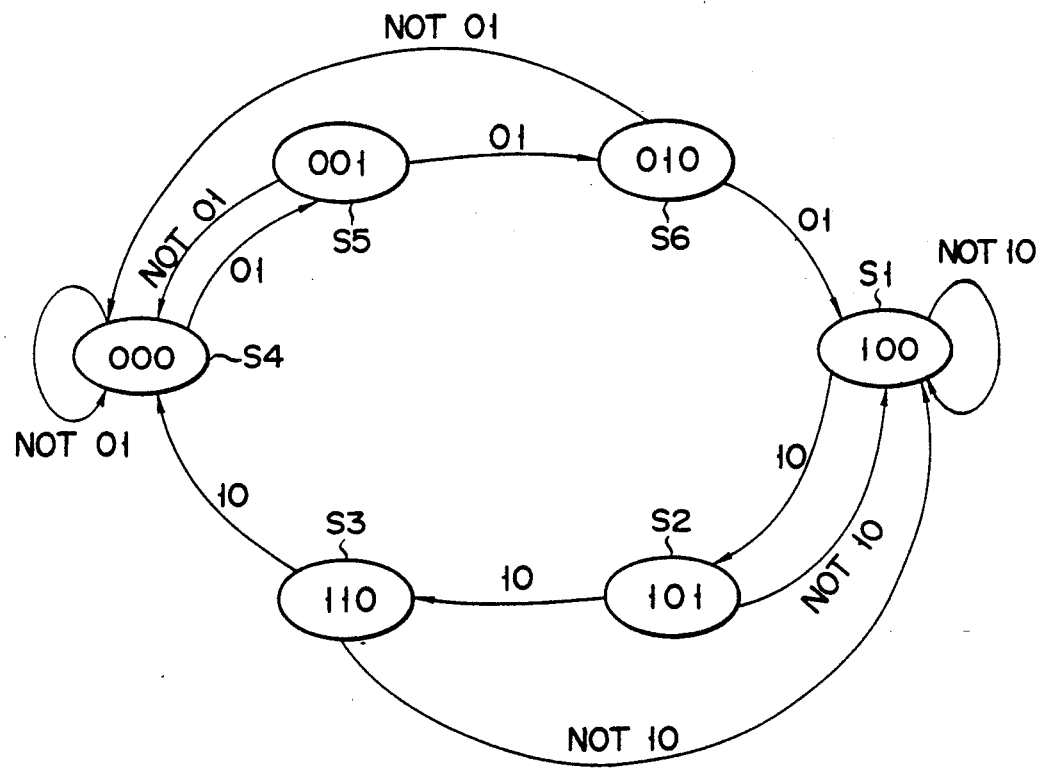
F I G. 9A
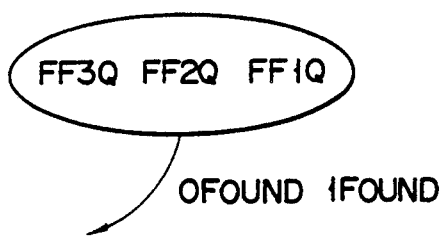
F I G. 9B

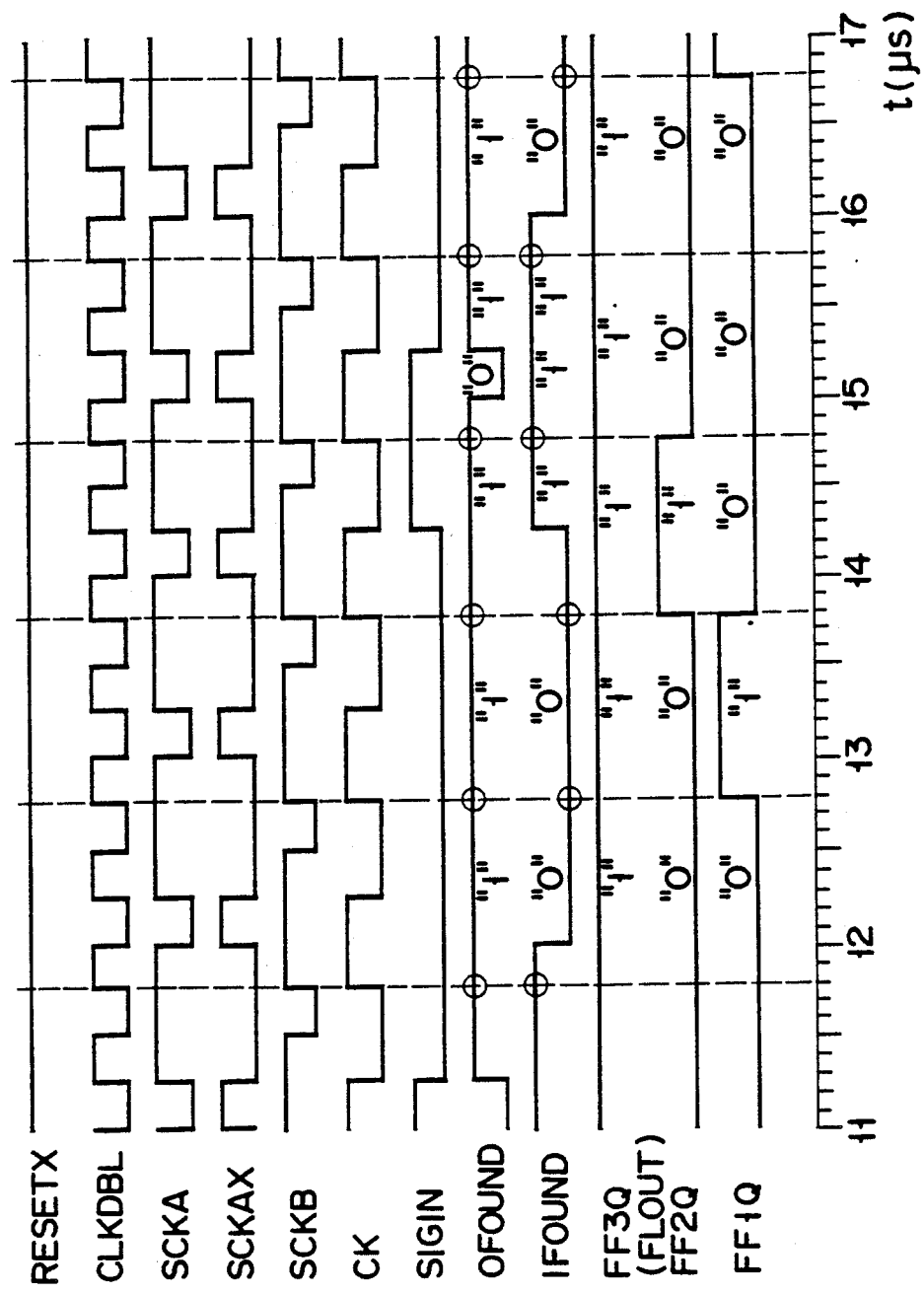
F I G. 10

CIRCUIT DEVICE FOR ELIMINATING NOISE FROM AN INPUT SIGNAL INDEPENDENT OF TIME OF ARRIVAL OF NOISE OR NOISE WIDTH

BACKGROUND OF THE INVENTION

1. Field of the Invention

The present invention relates to a noise eliminating circuit for monitoring an input signal continuously within its operating period and identifying a noise component contained in the input signal for its elimination to provide a noise-free normal signal.

2. Description of the Related Art

When a pulse-like noise component narrow in width is mixed into an input signal which is entered into a control device such as a microcomputer or control equipment using a microcomputer, a malfunction may often occur in the control device. For this reason, the control device is usually provided with a noise eliminator for eliminating such a noise component from the input signal.

A conventional noise eliminator is illustrated in FIG. 1. This conventional noise eliminator is arranged to decide that an input signal having a pulse width less than 3 $\mu$s is a noise component and eliminate it. The noise eliminator identifies an input signal alone that is greater than 3 $\mu$s in width as a normal input signal and provides it as an output signal (FLOUT).

In FIG. 1, an input signal is sampled in synchronism with the rising edges of a clock signal CK of a cycle of 1 $\mu$s and the samples of the input signal are sequentially held in edge-triggered type D flip-flop circuits (hereinafter a flip-flop circuit is abbreviated as an F/F) 1, 2 and 3 which are cascaded into a shift register.

When output signals N1, N2 and N3 of F/Fs 1, 2 and 3 are all at a logic "1" level as a result of sampling and holding of the input signal, this fact will indicate that the input signal was stable at a logic "1" level during three sampling intervals just before. Consequently the output (ALL1) of a logical product (AND) gate 4 having its input connected to the outputs of F/Fs 1, 2 and 3 goes to a logic "1" level, thereby causing an edge-triggered type JK F/F 5 to produce an output signal (FLOUT) at a logic "1" level.

On the other hand, when the outputs of F/Fs 1, 2 and 3 are all at a logic "0" level, it will indicate that the input signal was stably at a logic "0" level during three sampling intervals just before. As a result, the output (ALL0) of an AND gate 6 having its inputs connected to the inverted outputs of F/Fs 1, 2 and 3 goes to a logic "1" level, causing F/F 5 to produce an output signal at a logic "0" level.

When the outputs of F/Fs 1, 2 and 3 is in one of states other than (1, 1, 1) or (0, 0, 0), this means that the input signal was not in a stable state during those intervals. Since, under such a condition, the outputs of AND gates 4 and 6 are at a logic "0" level, the state of F/F 5 and thus its output signal do not change.

An operating waveform diagram of such a noise eliminator is illustrated in FIG. 2.

In FIG. 2, that waveform portion of the input signal (SIGN) indicated at A which is at a logic "1" level has an interval approximately equal to a period of four cycles of the clock signal (CK) and thus it is output as an output signal (FLOUT).

That waveform portion of the input signal indicated at B which is at a logic "1" level has an interval approximately equal to a period of one cycle of the clock signal and thus it is identified as a noise component and then eliminated so that it does not appear in the output signal.

However, when, like waveform portions as indicated at C, D, E and F, a noise component consisting of a train of pulses, which occur in succession over a period of time more than a period of three cycles of the clock signal and moreover in approximately the same cycle as the clock signal even if their respective widths (durations) are less than the clock signal period, is mixed into the input signal, a 1-level signal will appear in the output signal which has a duration approximately equal to a period of three cycles of the clock signal. This is due to the fact that the pulses indicated by waveform portions C, D, E and F were regarded as normal input signals although they were noise components to be eliminated. Thus, for such an input signal, the arrangement shown in FIG. 1 does not operate properly so as to meet requirements of a noise eliminator.

This is due to the fact that, in the arrangement of FIG. 1, the input signal is sampled in synchronism with the rising edges of the clock signal. That is, if narrow pulses occur intermittently which are at a logic "1" level or a logic "0" level at least when the clock signal rises, a noise component consisting of such narrow pulses will be identified as a normal signal that is continuous in level.

SUMMARY OF THE INVENTION

In order to overcome the disadvantages of the conventional noise eliminator described above, a method which shortens the period of the clock signal and hence the sampling interval of the input signal might be used. However, this would lead to a further disadvantage of an increase in the number of F/Fs for holding samples of the input signal with an increase in the number of samples of the input signal per unit time and hence an increase in circuit scale.

Even if the above method were used, malfunctions still would occur due to a noise component consisting of intermittent pulses narrow in width as compared with the cycle period of the clock signal. This is because the circuit of FIG. 1 monitors the input signal only at times of sampling of the input signal. Accordingly, it is essentially difficult for the circuit of FIG. 1 to operate properly without causing the above-described malfunctions.

It is therefore an object of the present invention to provide a noise eliminating circuit which allows pulses with a previously set width to be surely identified and eliminated as noise without leading to a considerable increase and complication of its circuit scale.

To achieve the object, the noise eliminating circuit according to a first aspect of the present invention comprises first and second detectors and an output determining section. The first detector continuously monitors the logic level of the input signal by use of at least one first detecting element for detecting that the input signal is at a first logic level and detects that the input signal has the first logic level within a predetermined operating cycle in response to the result of detection by the first detecting element every operating cycle. The second detector continuously monitors the logic level of the input signal by use of at least one second detecting element for detecting that the input signal is at a second logic level distinct from the first logic level and detects that the input signal has the second logic level within the predetermined operating cycle in response to the result of detection by the second detecting element every operating cycle. The output determining section determines its output signal such that the output signal is made at the first logic level in a first case where only the first detector continues its detection over a predetermined time period longer than the operating cycle, the output signal is made at the second logic level in a second case where only the second detector continues its detection over the predetermined time period, and the output signal is held at the logic level that it had so far in other cases than the first and second cases.

In a second aspect of the noise eliminating circuit of the present invention, the first detector continuously and alternately monitors the logic level of an input signal by use of a plurality of first detecting elements for detecting that the input signal is at a first logic level and detecting that the input signal has the first logic level within a predetermined operating cycle in accordance with the results of detection by the first detecting elements every operating cycle. The second detector continuously and alternately monitors the logic level of the input signal by use of a plurality of second detecting elements for detecting that the input signal is at a second logic level distinct from the first logic level and detecting that the input signal has the second logic level within the predetermined operating cycle in accordance with the results of detection by the second detecting elements every operating cycle. The output determining section determines its output signal such that the output signal is made at the first logic level in a first case where only the first detector continues its detection over a plurality of the operating cycles, the output signal is made at the second logic level in a second case where only the second detecting means continues its detection over a plurality of the operating cycles, and the output signal is held at the logic level that it had so far in other cases than the first and second cases.

In a third aspect of the noise eliminating circuit of the present invention, the first detector continuously monitors the logic level of the input signal by use of a pair of RS latch circuits which are reset in a predetermined operating cycle and operated alternately to latch the first logic level of the input signal, a latch means for temporarily latching an output of one of the pair of RS latch circuits and a logical OR circuit for logical ORing outputs of the other of the pair of RS latch circuits and the latch circuit and detecting that the input signal has the first logic level within the operating cycle in response to the result of latch by the pair of RS latch circuits every operating cycle. The second detector continuously monitors the logic level of the input signal by use of a pair of RS latch circuits which are reset in the predetermined operating cycle and operated alternately to latch a second logic level of the input signal, a latch means for temporarily latching an output of one of the pair of RS latch circuits and a logical OR circuit for logical ORing outputs of the other of the pair of RS latch circuits and the latch means and detecting that the input signal has the second logic level within the operating cycle in response to the result of latch by the pair of RS latch circuits every operating cycle. The output determining section determines its output signal such that the output signal is made at the first logic level in a first case where only said first detector continues its detection over a plurality of the operating cycles, the output signal is made at the second logic level in a second case where only the second detector continues its detection over a plurality of the operating cycles, and the output signal is held at the logic level that it had so far in other cases than the first and second cases.

With the noise eliminating circuit of the present invention, the logic level of the input signal are continuously monitored during the predetermined operating cycle period for first and second logic levels. In a case where it is decided that the input signal continues to be at a predetermined logic level for a predetermined time period longer than the operating cycle period, the output signal is made to be at the logic level of the input signal. In other cases the output signal is held at a logic level that it has so far. In this way noise generated in the input signal is identified and eliminated so that a normal signal is obtained as an output signal.

According to the noise eliminating circuit of the present invention, since variations in the logic level of the input signal are continuously monitored for each of the first and second logic levels within the operating cycle, noise can surely be identified and eliminated from the input signal without depending on time of arrival of noise generated in the input signal and noise width.

Additional objects and advantages of the invention will be set forth in the description which follows, and in part will be obvious from the description, or may be learned by practice of the invention. The objects and advantages of the invention may be realized and obtained by mean of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIGS. 4 through 7 illustrate detailed circuit arrangements of various parts of the circuit of FIG. 3;

FIGS. 9A and 9B are state transition diagrams explanatory of the operation of the circuit of FIG. 6; and FIGS. 10 and 11 are timing diagrams explanatory of the operation of the circuit of FIG. 3.

DETAILED DESCRIPTION OF THE PREFERRED EMBODIMENT

An embodiment of the present invention will be described with reference to the accompanying drawings.

Figure 3:
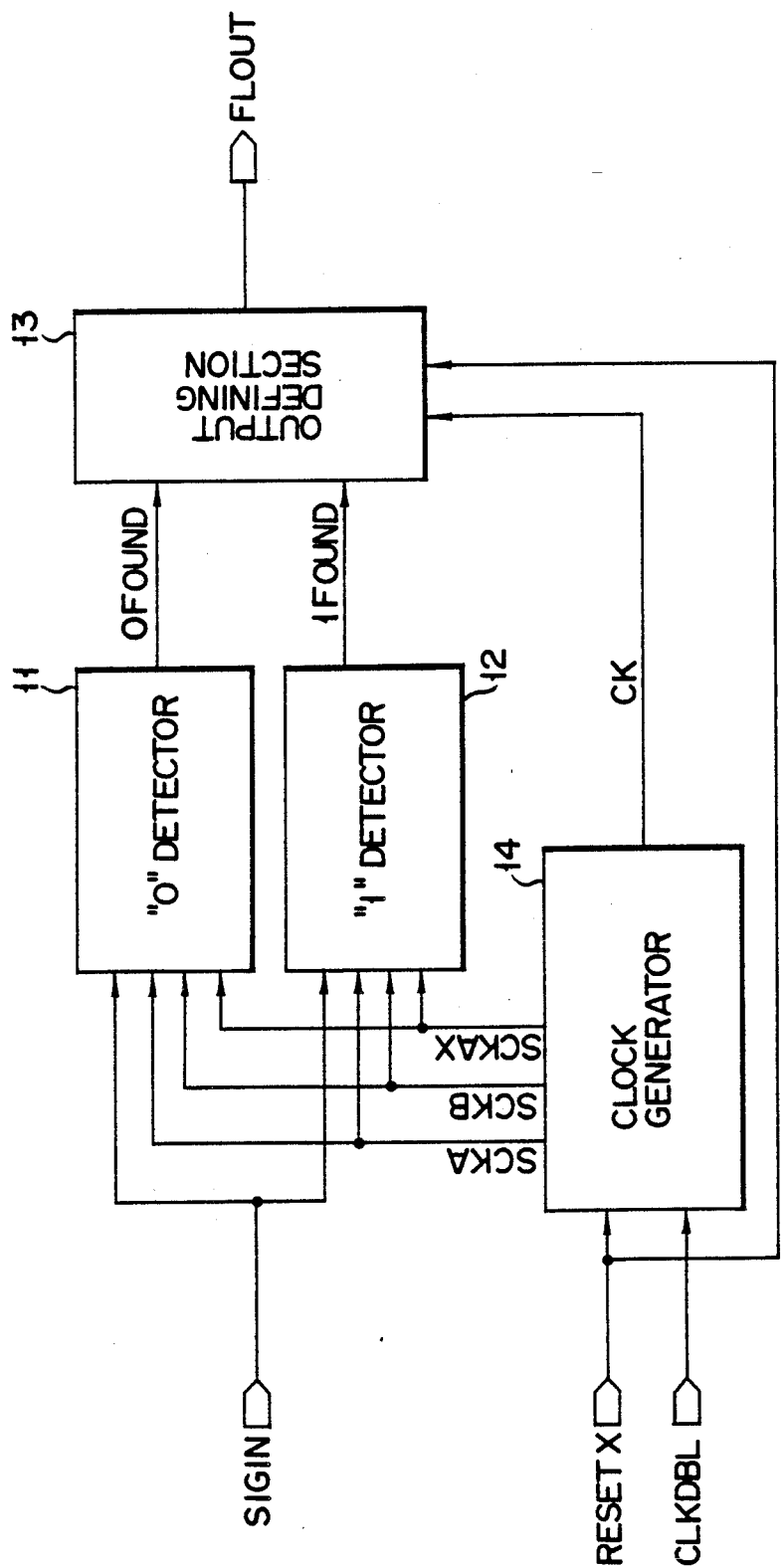
FIG. 3 is a block diagram of a noise eliminating circuit according to an embodiment of the present invention.

FIG. 3 illustrates an arrangement of a noise eliminator embodying the present invention, and FIGS. 4 through 7 illustrate detailed circuit arrangements of various parts comprising the noise eliminator of FIG. 3.

The noise eliminator continuously monitors variations in an input signal over a predetermined operating cycle.

The noise eliminator of FIG. 3 is comprised of a "0" detector, a "1" detector 12, an output defining section 13 and a clock generator 14.

"0" detector 11 monitors an input signal (SIGIN) continuously during a time period of a predetermined operating cycle which is cycle of noise eliminating process defined by the cycle of a clock signal (CK) so as to detect whether or not the input signal goes to a "0" level even for once within the predetermined operating cycle period. When detecting a "0" level of the input signal, "0" detector 11 sends a "1" level signal, i.e., a "0" detect signal (0FOUND), to output defining section 13.

"1" detector 12 is the same as "0" detector 11 except that it detects a "1" level of the input signal. When detecting a "1" level of the input signal, therefore, "1" detector 12 provides a "1" level signal, i.e., a "1" level detect signal (1FOUND), to output defining section 13.

Output defining section 13 operates in synchronism with the clock signal to determine its next internal state and output signal (FLOUT) on the basis of a current internal state and "0" and "1" detect signals at the present time. Output defining section 13 has a function of discriminating between a normal signal component (an inherent input signal) and a noise component contained in the input signal. A criterion for discriminating between a normal signal and a noise component may be set arbitrarily according to specifications required of the noise eliminator.

Clock generating section 14 generates operation timing signals applied to "0" detector 11, "1" detector 12 and output defining section 13, namely, signals (SCKA), (SCKB), (SCKAX) and clock signal (CK) in response to externally applied a reset signal (RESETX) and a basic clock signal (CLKDBL) having a frequency twice that of clock signal (CK).

Next, specific circuit arrangements of various components described above and their operation will be described with reference to FIGS. 4 through 10.

Figure 8:
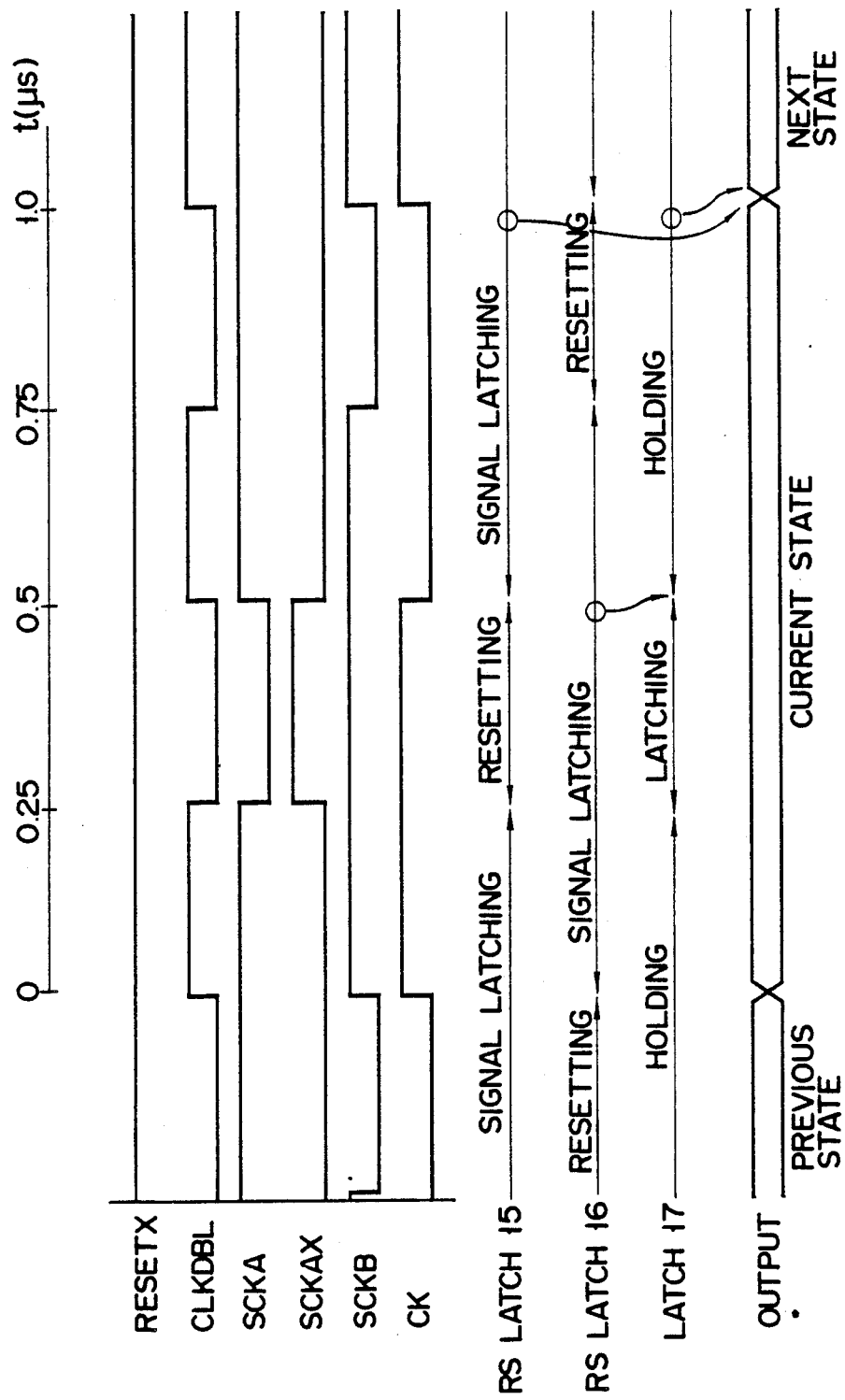
FIG. 8 is a timing diagram explanatory of the operation of the circuit arrangement of FIG. 4.

FIG. 4 illustrates a specific arrangement of "1" detector 12 of FIG. 3 and FIG. 8 illustrates a timing diagram of the arrangement of FIG. 4.

As shown in FIG. 4, "1" detector 12 comprises two RS (reset-set) latch circuits 15 and 16 each having a combination of three NOT-AND (NAND) gates, a type-D latch circuit 17 and a NAND gate 18.

Each of RS latch circuits 15 and 16 detects a "1" level of its input signal. As depicted in FIG. 8, RS latch circuit 15 latches and holds an input signal when the signal (SCKA) is at a "1" level and is reset when the signal (SCKA) is at a "0" level, while RS latch circuit 16 latches and holds an input signal when the signal (SCKB) is at a "1" level and is reset when the signal (SCKB) is at a "0" level.

As illustrated in FIG. 8, the signal (SCKA) and the signal (SCKB) are synchronized with the clock signal (CK) and have a phase difference (180° in this case) therebetween such that the signal (SCKB) is at a "1" level when the signal (SCKA) is at a "0" level, and the signal (SCKA) is at a "1" level when the signal (SCKB) is at a "0" level. A 1-level input signal is always latched and held by either of RS latch circuits 15 and 16 responsive to the signals (SCKA) and (SCKB).

With the circuit described above, therefore, the input signal is continuously monitored in the clock signal (CK) cycle. In addition, so long as a "1" level period of the input signal is long enough for RS latch circuits 15 and 16 to respond, the circuit can surely monitor the input signal without depending on a relation between the time of arrival of a noise component and the internal timing.

Latch circuit 17 latches the output of RS latch circuit 16 in synchronism with the rise of a signal (SCKAX) which is an inversion of the signal (SCKA) and holds it until the clock signal rises next. The inverted output of latch circuit 17 is sent to NAND gate 18. That is, latch circuit 17 holds the state of the input signal monitored by latch circuit 16 when RS latch circuit 15 is reset until the clock signal (CK) enters the next cycle. Latch circuit 17 is provided for preventing the state of the input signal monitored by latch circuits 15 and 16 when the clock signal (CK) enters the next cycle, i.e., when the clock signal rises from becoming unstable due to resetting of latch circuit 16, thereby performing a stable detecting operation.

NAND gate 18 receives the inverted output of RS latch circuit 15 and the inverted output of latch circuit 17 to provide the negative NAND thereof. Thus, when at least one of the input signals to NAND gate 18 goes to a "0" level even for once in one cycle period of the clock signal (CK), the output of NAND gate 18 goes to a "1" level, providing a "1" detect signal (1FOUND).

FIG. 5 illustrates a specific arrangement of "0" detector 11. "0" detector 11 comprises, in addition to the same arrangement as "1" detector 12, an inverter gate 19 which provides an inversion of the input signal to RS latch circuits 15 and 16. As with "1" detector 12, therefore, "0" detector 11 produces a "0" detect signal (0FOUND) at a "1" level when the input signal goes to a "0" level even for once during one cycle period of the clock signal (CK).

Figure 6:
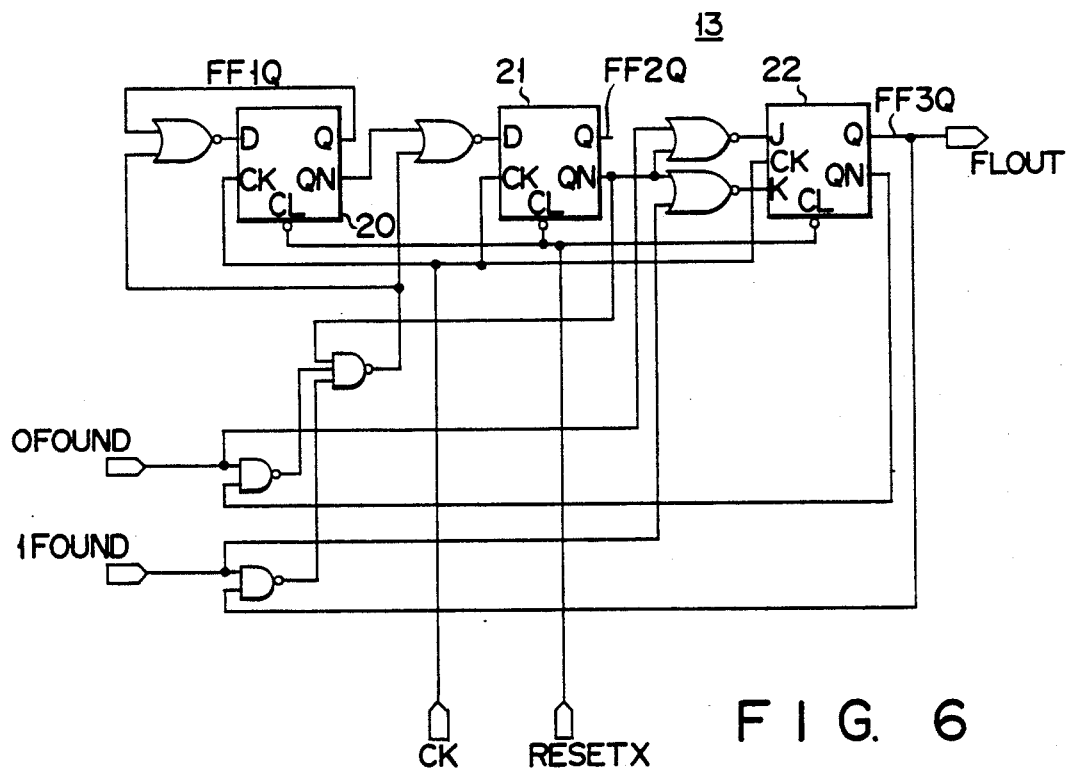

FIG. 6 illustrates a specific arrangement of output defining section 13, and FIGS. 9A and 9B illustrate state transition diagrams of the output defining section of FIG. 6.

As shown in FIG. 6, output defining section 13 is primarily comprised of type-D F/Fs 20 and 21 and a JK F/F 22, which are synchronous sequential logic circuits which respond to rising edges of the clock signal (CK) to change their states. Each of F/Fs 20, 21 and 22 shown in FIG. 6 progresses through various states as shown in FIG. 9.

In FIG. 9A, the output of each of the F/Fs can progress through six states S1 through S6. With the notation of the state transition diagram of FIG. 9A, as shown in FIG. 9B, output values (FF1Q), (FF2Q) and (FF3Q) of F/Fs 20, 21 and 22 respectively are described in nodes representing states thereof, which are ellipses, from right to left, and values of the "0" detect signal (0FOUND) and the "1" detect signal (1FOUND) are described in the neighborhoods of arrows which show how transitions are made from state to state.

In FIG. 9A, with F/Fs 20, 21 and 22 in the starting state S1, if the "0" detect signal (0FOUND) and the "1" detect signal (1FOUND) are at a "1" level and a "0" level, respectively, for a period of three cycles of the clock signal, the state of F/Fs 20, 21 and 22 progresses from S1 through S2 and S3 to S4. When the state of F/Fs 20, 21 and 22 enters state S4 as a result of the state transitions, FF3Q which is the output of output defining section 13 goes to a "0" level. That is, when a "0" state of the input signal continues to be detected over a period of three cycles of the clock signal (CK), the output signal of the output defining section goes to a "0" level.

With F/Fs 20, 21 and 22 in one of states S1, S2 and S3, on the other hand, if the "0" and "1" detect signals are in one of other sates than "10", that is, if at least one of the "0" and "1" detect signals represents a "1" level of the input signal, the state of F/Fs 20, 21 and 22 goes back to state S1 and thus the output signal does not change its level.

Next, with F/Fs 20, 21 and 22 in state S4, if the "0" detect signal and the "1" detect signal (1FOUND) are at a "0" level and a "1" level, respectively, for a period of three cycles of the clock signal, the states of F/Fs 20, 21 and 22 progress from S4 through S5 and S6 to S1. When the state of F/Fs 20, 21 and 22 enters state S1 as a result of the state transitions, FF3Q which is the output of output defining section 13 goes to a "1" level. That is, when a "0" state of the input signal continues to be detected over a period of three cycles of the clock signal (CK), the output signal of the output defining section goes-to a "1" level.

With F/Fs 20, 21 and 22 in one of states S4, S5 and S6, on the other hand, if the "0" and "1" detect signals are in one of other sates than "01", that is, if at least one of the "0" and "1" detect signals represents a "0" level of the input signal, the state of F/Fs 20, 21 and 22 goes back to state S4 and thus the output signal does not change its value.

In this way, when the 0-level state of the input signal, which is represented by the "0" detect signal at a "1" level and the "1" detect signal at a "0" level, stably continues for a period of three or more cycles of the clock signal (CK), the input signal is identified as a normal "0" level signal. Also, when the 1-level state of the input signal, which is represented by the "0" detect signal at a "0" level and the "1" detect signal at a "1" level, stably continues for a period of three or more cycles of the clock signal (CK), the input signal is identified as a normal "1" level signal. In the present embodiment, a period of three cycles of the clock signal (CK) is used for a criterion for discriminating between a normal input signal and noise, but this, of course, may be set according to specifications.

FIG. 10 illustrates an example of operating waveforms of output defining section 13 shown in FIG. 6.

In FIG. 10, the input signal (SIGIN) is in 0-level state for a period from 12 μs to 14 μs so that "0" detect signal (0FOUND)=1 and "1" detect signal (1FOUND)=0 last two cycles of the clock signal (CK). Consequently, output defining section 13 changes its internal state (FF3Q, FF2Q, FF1Q) from (100) through (101) to (110). That is, the transition of the internal state of output defining section 13 has occurred until immediately prior to a change from 1-level output state (FF3Q) to 0-level output state.

Figure 7:
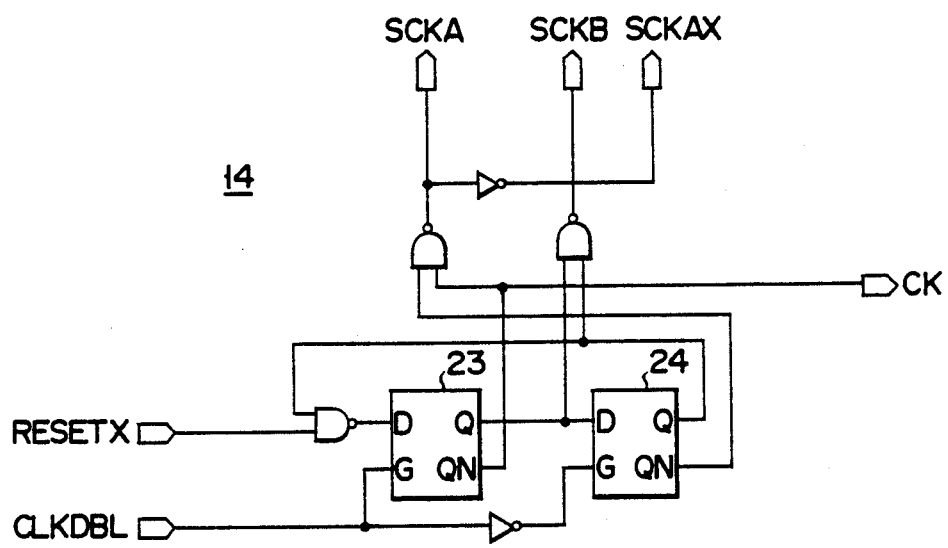

Clock generating section 14 of FIG. 7 is primarily composed of type-D F/Fs 23 and 24, which supply the generated clock signal (CK) to output defining section 13 and the signals (SCKA), (SCKB) and (SCKAX) to "0" and "1" detectors 11 and 12. Those timing signals may be applied externally to output defining section 13 and detectors 11 and 12.

Figure 1:
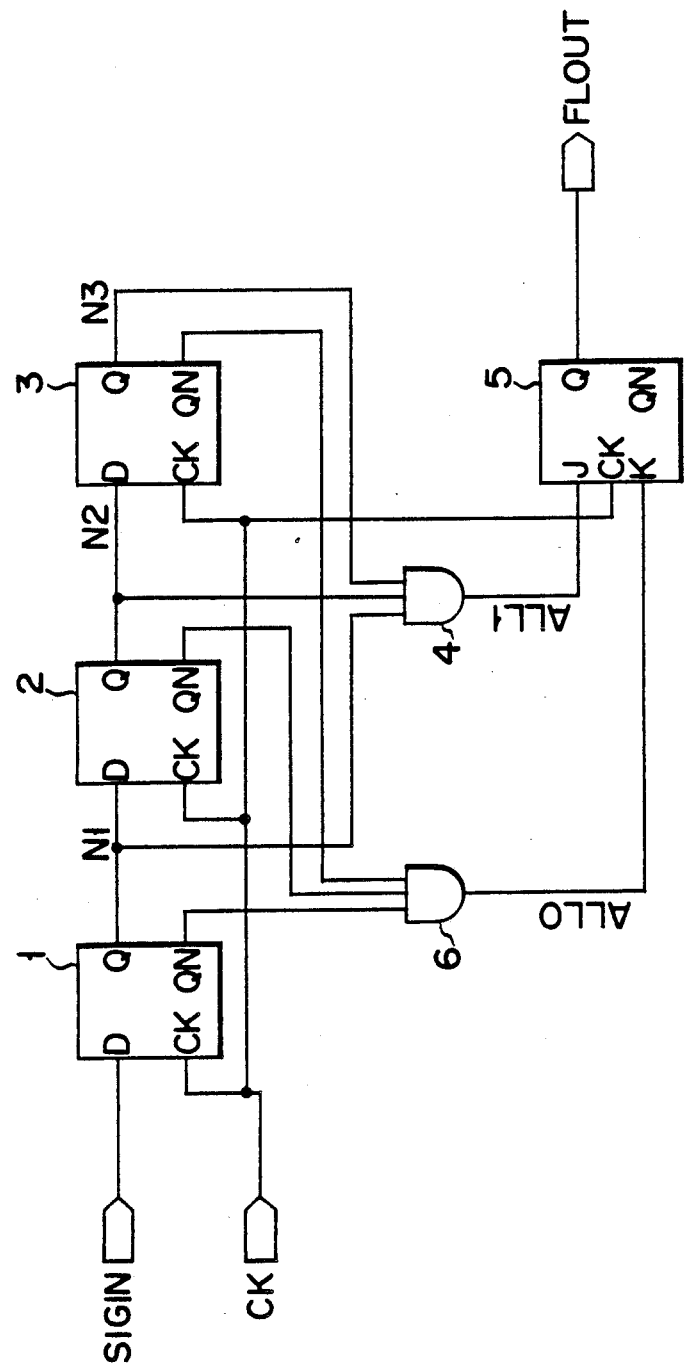
FIG. 1 is a circuit diagram of a conventional noise eliminating circuit.
Figure 2:
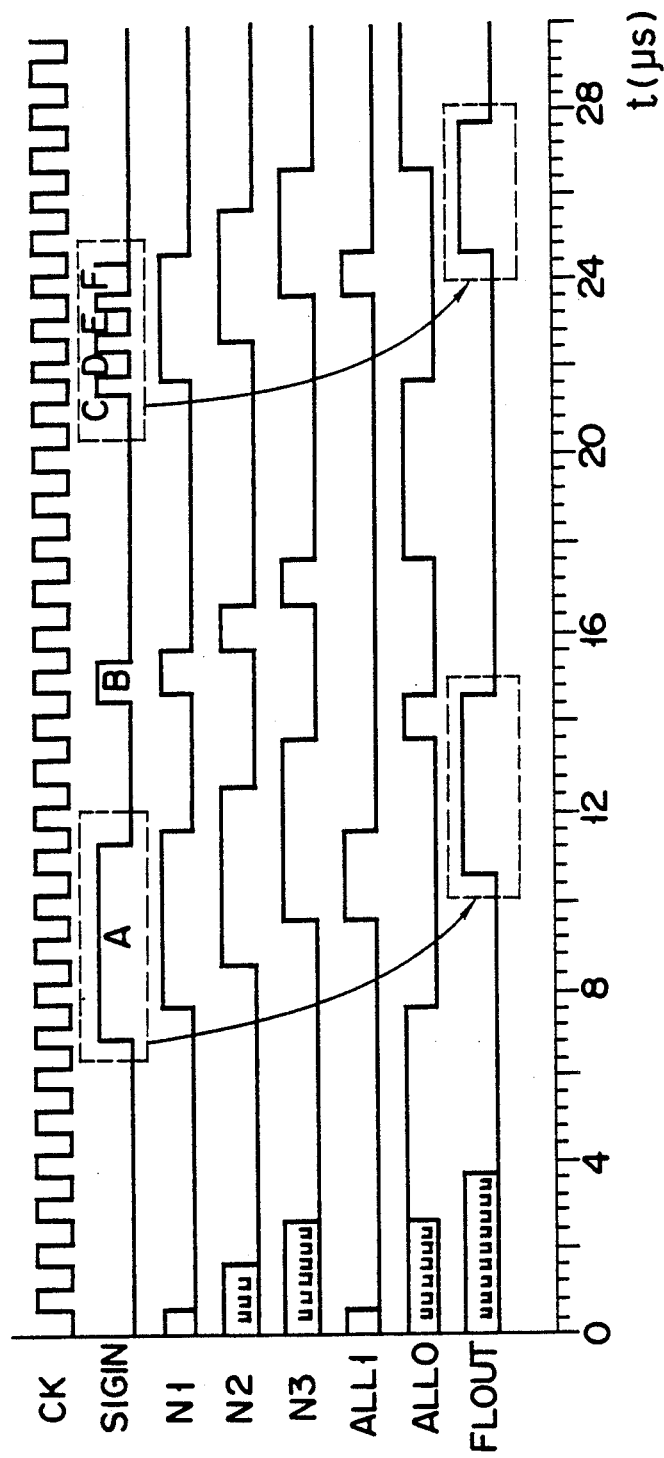
FIG. 2 is a timing diagram explanatory of the operation of the circuit of FIG. 1.
Figure 11:
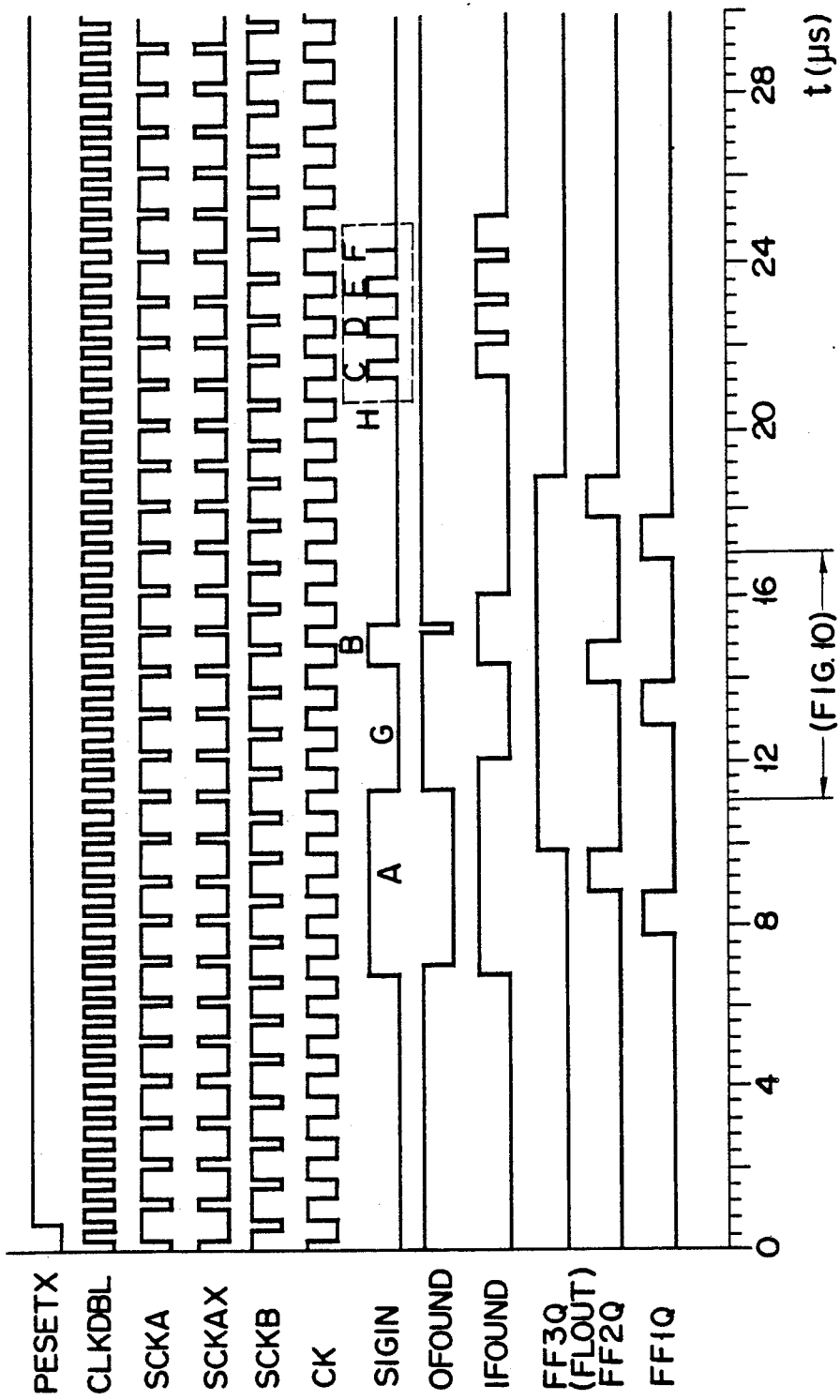

It is assumed that, in such an arrangement of noise eliminating circuit, the input signal (SIGIN) changes, for example, as shown in FIG. 11 (as in FIG. 2). (FIG. 10 is an enlarged view of a part of FIG. 11.)

A change in the input signal (SIGIN) from a "0" level to a "1" level occurs at a portion indicated at A in FIG. 11. "0" and "1" detector 11 and 12 detect the change in the input signal so that the "0" detect signal goes from a "1" level to a "0" level and the "1" detect signal goes from a "0" level to a "1" level. Thereby, the state (FF3Q, FF2Q, FF1Q) of F/Fs 20, 21 and 22 of output defining section 13 is changed from S4(0 0 0) through S5(0 0 1) and S6(0 1 0) to S1(1 0 0). As a result, the output signal (FLOUT) goes from a "0" level to a "1" level, providing the input signal portion A as a normal input signal.

Next, signal input goes from a "1" level to a "0" level at a portion indicated at G. In response to this change the "0" detect signal goes from a "0" level to a "1" level and the "1" detect signal goes from a "0" level to a "1" level. As a result, the state of F/Fs 20, 21 and 22 goes from S1(1 0 0) through S2(1 0 1) to S3(1 1 0).

However, since the 0-level period of the input signal as indicated by G is shorter than the three-cycle period of the clock signal (CK) and the input signal goes from a "0" level to a "1" level as indicated by B, the state of F/Fs 20, 21 and 22 is changed from S3(1 1 0) to S1(1 0 0). That is, although changes in the state has occurred from when the output signal is stably in a 1-level state until immediately before it is changed to a "0" level, the change in the input signal indicated by G is identified as noise because the 0-level period of the input signal indicated by G is not equal to or more than the period of three cycles of the clock signal. As a result, the 0-level period of the input signal indicated by G is eliminated as a noise component. The normal signal is identified as a "1" level over a period extending from the input signal portion indicated by A to the portion indicated by B, and the 1-level signal is taken as the output signal.

When the input signal contains a portion consisting of narrow pulses as indicated by H in FIG. 11, the signal 0FOUND maintains a "1" level, and the signal "1FOUND" changes as shown in FIG. 11. Thus, the internal state (FF3Q, FF2Q, FF1Q) of output defining section 13 stays in S4(0 0 0) so that the output signal is held at a "0" level. In this manner, even if a noise component consisting of narrow pulses coming at short intervals which will cause a malfunction in the conventional device is contained in an input signal, it can surely be identified as noise and removed from the input signal.

Although the preferred embodiment of the present invention has been disclosed and described, it is apparent to those skilled in the art that other embodiments and modifications are possible.

For example, for the "0" and "1" detectors much more RS latch circuits may be used which are operated alternately and continuously. Each of the "0" and "1" detectors may be composed of a single detecting element which can continuously detect logic levels and sequentially output the results of detection during a predetermined period.

As the output-defining circuit, any type of circuit may be used so long as it can detect that the detection by only one of the "0" and "1" detectors has lasted a predetermined number of times or a predetermined period. For example, a combined circuit of a counter, a timer and a resetting circuit therefore may be used.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A noise eliminating circuit comprising:
   first detecting means for continuously monitoring the logic level of an input signal by use of at least one first detecting element for detecting that the input signal is at a first logic level and detecting that the input signal has said first logic level within a predetermined operating cycle in accordance with the result of detecting by said first detecting element every said operating cycle;

second detecting means for continuously monitoring the logic level of said input signal by use of at least one second detecting element for detecting that the input signal is at a second logic level and detecting that the input signal has said second logic level within said predetermined operating cycle in accordance with the result of detection by said second detecting element every said operating cycle; and output determining means coupled to said first and second detecting means for determining its output signal such that said output signal is at said first logic level in a first case where only said first detecting means continues its detecting over a predetermined time period longer than said operating cycle, said output signal is at said second logic level in a second case where only said second detecting means continues its detection over said predetermined time period, and said output signal is held at the logic level value that it had previously, when the input signal is not at said first logic level and not at said second logic level, including means for deciding the results of detection by said first and second detecting means every said operating cycle and determining said predetermined period according to the number of decisions made by said first and second detecting means.

2. A noise eliminating circuit comprising:

first detecting means for continuously monitoring the logic level of an input signal by use of at least one first detecting element for detecting that the input signal is at a first logic level and detecting that the input signal has said first logic level within a predetermined operating cycle in accordance with the result of detection by said first detecting element every said operating cycle;

second detecting means for continuously monitoring the logic level of said input signal by use of at least one second detecting element for detecting that the input signal is at a second logic level and detecting that the input signal has said second logic level within said predetermined operating cycle in accordance with the result of detection by said second detecting element every said operating cycle; and output determining means coupled to said first and second detecting means for determining its output signal such that said output signal is at said first logic level in a first case where only said first detecting means continues its detection over a predetermined time period longer than said operating cycle, said output signal is at said second logic level in a second case where only said second detecting means continues its detection over said predetermined time period, and said output signal is held at the logic level value that it had previously, when the input signal is not at said first logic level and not at said second logic level;

wherein said first detecting means comprises a plurality of said first detecting elements to be operated alternately so that an interval in which all of said first detecting elements are not operated and may not be produced, in order to monitor said input signal continuously.

3. A noise eliminating circuit according to claim 2, in which said first detecting elements are reset periodically in said predetermined operating cycle.

4. A noise eliminating circuit according to claim 3, in which said first detecting means includes at least one latch means for holding the result of detection by at least one of said first detecting elements.

5. A noise eliminating circuit according to claim 2, in which operating periods of said first detecting elements are overlapped.

6. A noise eliminating circuit comprising:

first detecting means for continuously monitoring the logic level of an input signal by use of at least one first detecting element for detecting that the input signal is at a first logic level and detecting that the input signal has said first logic level within a predetermined operating cycle in accordance with the result of detection by said first detecting element every said operating cycle;

second detecting means for continuously monitoring the logic level of said input signal by use of at least one second detecting element for detecting that the input signal is at a second logic level and detecting that the input signal has said second logic level within said predetermined operating cycle in accordance with the result of detection by said second detecting element every said operating cycle; and output determining means coupled to said first and second detecting means for determining its output signal such that said output signal is at said first logic level in a first case where only said first detecting means continues its detection over a predetermined time period longer than said operating cycle, said output signal is at said second logic level in a second case where only said second detecting means continues its detection over said predetermined time period, and said output signal is held at the logic level value that it had previously, when the input signal is not at said first logic level and not at said second logic level;

wherein said second detecting means comprises a plurality of said second detecting elements to be operated alternately so that an interval in which all of said second detecting elements are not operated and may not be produced, in order to monitor said input signal continuously.

7. A noise eliminating circuit according to claim 6, in which said second detecting elements are reset periodically in said predetermined operating cycle.

8. A noise eliminating circuit according to claim 7, in which said second detecting means includes at least one latch means for holding the result of detection by at least one of said second detecting elements.

9. A noise eliminating circuit according to claim 6, in which operating periods of said second detecting elements are overlapped.

10. A noise eliminating circuit comprising:

first detecting means for continuously and alternately monitoring the logic level of an input signal by use of a plurality of first detecting elements for detecting that the input signal is at a first logic level and detecting that the input signal has said first logic level within a predetermined operating cycle in accordance with the results of detection by said first detecting elements every said operating cycle;

second detecting means for continuously and alternately monitoring the logic level of said input signal by use of a plurality of second detecting elements for detecting that the input signal is at a second logic level distinct from said first logic level and detecting that the input signal has said second logic level within said predetermined operating cycle in accordance with the results of detection by said second detecting elements every said operating cycle; and output determining means coupled to said first and second detecting means for determining its output signal such that said output signal is at said first logic level in a first case where only said first detecting means continues its detection over a plurality of said operating cycles, said output signal is at said second logic level in a second case where only said second detecting means continues its detection over a plurality of said operating cycles, and said output signal is held at the logic level that it had previously, when the input signal is not at said first logic level and not at said second logic level.

11. A noise eliminating circuit according to claim 10, in which said first and second detecting elements are reset periodically in said predetermined operating cycle.

12. A noise eliminating circuit according to claim 11, in which said first and second detecting means include latch means for holding the result of detection by at least one of said first and second detecting elements.

13. A noise eliminating circuit according to claim 10, in which operating periods of said first and second detecting elements are overlapped.

14. A noise eliminating circuit according to claim 10, in which said output determining means includes means for deciding the results of detection by said first and second detecting means every said operating cycle and determining said predetermined period according to a number of results of detection made by said first and second detecting means.

15. A noise eliminating circuit comprising:
first detecting means for continuously monitoring the logic level of an input signal by use of a pair of reset-set latch means which are reset in a predetermined operating cycle and operated alternately to latch a first logic level of the input signal, a latch means for temporarily latching an output of one of said pair of reset-set latch means and a logical means for logically combining outputs of the other of said pair of reset-set latch means and said latch means and detecting that the input signal has said first logic level within said operating cycle in response to the result of latch by said pair of reset-set latch means every said operating cycle;

second detecting means for continuously monitoring the logic level of the input signal by use of a pair of reset-set latch means which are reset in said predetermined operating cycle and operated alternately to latch a second logic level of the input signal, a latch means for temporarily latching an output of one of said pair of reset-set latch means and a logical means for logically combining outputs of the other of said pair of reset-set latch means and said latch means and detecting that the input signal has said second logic level within said operating cycle in response to the result of latch by said pair of reset-set latch means every said operating cycle; and output determining means coupled to said first and second detecting means for determining its output signal such that said output signal is at said first logic level in a first case where only said first detecting means continues its detection over a plurality of said operating cycles, said output signal is at said second logic level in a second case where only said second detecting means continues its detection over a plurality of said operating cycles, and said output signal is held at the logic level that it had previously, when the input signal is not at said first logic level and not at said second logic level.

16. A noise eliminating circuit according to claim 15, in which operating periods of said pair of reset-set latch means of each of said first and second detecting elements are overlapped.

17. A noise eliminating circuit according to claim 15, in which said output determining means includes means for deciding the results of detection by said first and second detecting means every said operating cycle and determining said plurality of operating cycles according to the number of decisions made by said first and second detecting means.

* * * * *